(12) United States Patent
Butzmann

(10) Patent No.: US 7,141,967 B2
(45) Date of Patent: Nov. 28, 2006

(54) SENSOR ARRANGEMENT

(75) Inventor: Stefan Butzmann, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 169 days.

(21) Appl. No.: 10/496,482

(22) PCT Filed: Nov. 22, 2002

(86) PCT No.: PCT/IB02/04956

§ 371 (c)(1),
(2), (4) Date: May 24, 2004

(87) PCT Pub. No.: WO03/046594

PCT Pub. Date: Jun. 5, 2003

(65) Prior Publication Data

US 2004/0257069 A1   Dec. 23, 2004

(30) Foreign Application Priority Data

Nov. 27, 2001   (DE) ................. 101 58 053

(51) Int. Cl.
*G01R 33/025* (2006.01)
*G01R 33/09* (2006.01)
*G01B 7/14* (2006.01)

(52) U.S. Cl. ................. 324/252; 324/207.21

(58) Field of Classification Search ............. 324/252, 324/207.21, 207.12, 260; 338/32 R, 32 H; 360/314, 325, 327.11
See application file for complete search history.

(56) References Cited

U.S. PATENT DOCUMENTS

| | | | | |
|---|---|---|---|---|
| 5,585,719 | A * | 12/1996 | Endo et al. | 324/235 |
| 6,066,947 | A * | 5/2000 | Tamura | 324/207.21 |
| 6,100,686 | A * | 8/2000 | Van Delden et al. | 324/252 |
| 6,501,678 | B1 * | 12/2002 | Lenssen et al. | 365/173 |
| 6,828,781 | B1 * | 12/2004 | Butzmann | 324/207.19 |
| 6,949,927 | B1 * | 9/2005 | Goetz | 324/252 |

* cited by examiner

Primary Examiner—Edward Lefkowitz
Assistant Examiner—Kenneth J. Whittington
(74) Attorney, Agent, or Firm—Peter Zawilski

(57) ABSTRACT

A sensor arrangement includes at least two half bridges coupled together to form at least a Wheatstone bridge, and includes at least two magnetoresistive sensor elements in each half bridge. These sensor elements are sensitive along a measuring direction to the magnetic field strength of an applied magnetic field and are adapted to supply a measuring signal in dependence upon a field component of the magnetic field, denoted as a measuring field and measured in the measuring direction. In each half bridge, at least two of the sensor elements have barberpole structures with a mutually different alignment. The co-ordinates of the sensor elements of at least one of the half bridges and the co-ordinates of the sensor elements of at least another one of the half bridges are chosen to be different to a predetermined extent along an axis of co-ordinates extending in the measuring direction.

13 Claims, 9 Drawing Sheets

SENSOR ARRANGEMENT

Figure 1:
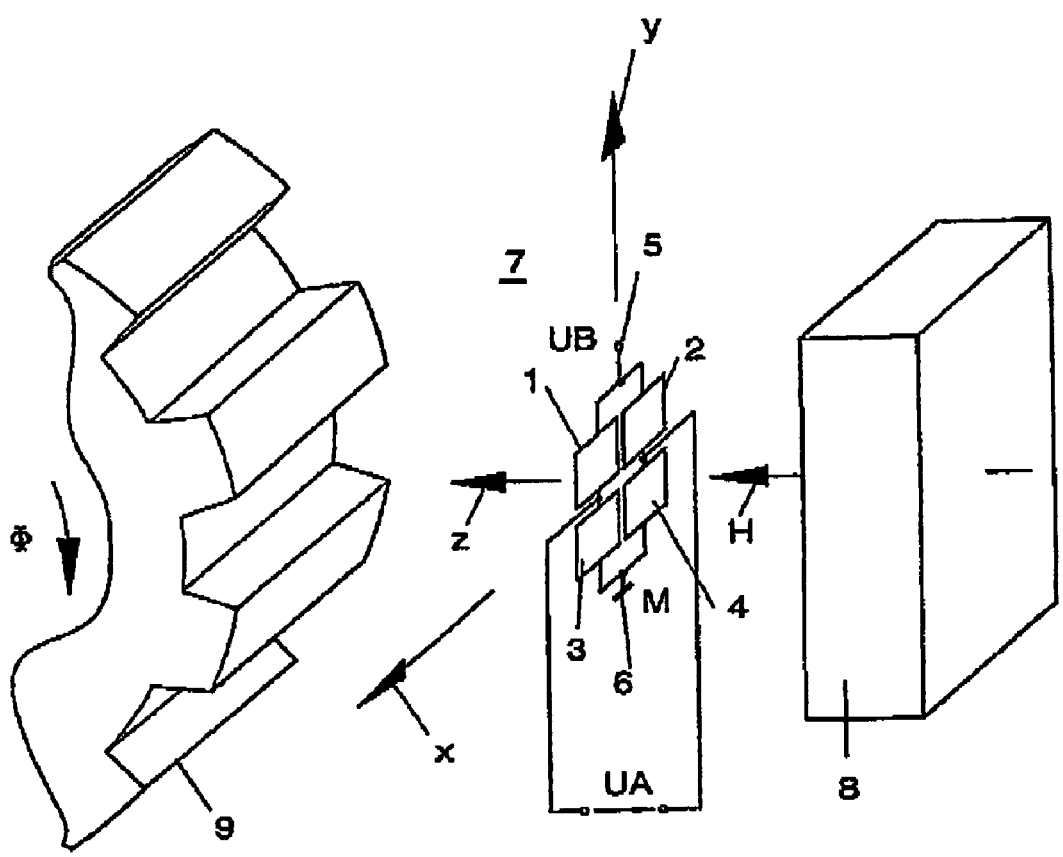

The invention relates to a sensor arrangement.

Arrangements for measuring the rotational speed of a rotating motion sensor element comprising a sensor arrangement utilizing the magnetoresistive effect have been described. This magnetoresistive sensor arrangement comprises four permalloy strips which are arranged on a silicon substrate in a meandering pattern and configured as a Wheatstone bridge. The magnetoresistive sensor arrangement is sensitive along a measuring direction to the polarity and the field strength of an external magnetic field and adapted to supply a measuring signal in dependence upon a field component of the magnetic field, denoted as measuring field and measured in the measuring direction.

Since, due to the magnetoresistive effect, a rotational movement of the motion sensor element cannot be directly measured, a permanent magnet denoted as working magnet is additionally fixed to the magnetoresistive sensor arrangement. This working magnet is stuck to the rear side of the magnetoresistive sensor arrangement or its housing so that the magnetoresistive sensor arrangement is permeated with the magnetic field of the working magnet, although in this assembly itself a field component of the magnetic field will not occur in the measuring direction without the motion sensor element. The measuring signal supplied by the magnetoresistive sensor arrangement is equal to zero in this configuration.

When a motion sensor element formed like a gear wheel of a ferromagnetic material is arranged in the vicinity of the sensor arrangement, this will lead to a change of the field variation of the magnetic field of the working magnet. To this end, the measuring direction of the magnetoresistive sensor arrangement is aligned in the direction of movement of the motion sensor element with respect to the teeth of the motion sensor element formed like a gear wheel of ferromagnetic material. The teeth of the motion sensor element thus move past the sensor arrangement in this measuring direction. Along the motion co-ordinate of the motion sensor element coinciding with the measuring direction, this leads to a distortion of the field lines of the magnetic field of the working magnet in the measuring direction of the sensor arrangement, which distortion occurs periodically with respect to the distance between the teeth of the gear wheel-like shape of the motion sensor element. In a "symmetrical" position, in which the sensor arrangement is centered in front of a tooth or in a gap between two teeth, the magnetic field is not distorted in the direction of movement of the motion sensor element, so that the output signal of the sensor arrangement is equal to zero in this position. In a "non-symmetrical" position, in which the sensor arrangement is neither centered in front of a tooth nor in front of a gap, the magnetic field is distorted in the direction of movement of the motion sensor element, which depends on the motion co-ordinate of the motion sensor element. The sensor arrangement thereby generates an output signal which is dependent on this motion co-ordinate of the motion sensor element, which output signal may be preferably at least substantially sinusoidal on the motion co-ordinate.

A magnetized motion sensor element has also been described by way of option, in which magnetic North and South poles of alternating polarity are arranged along its direction of movement. In this form, the motion sensor element itself provides the magnetic field and thereby also the measuring field.

Such magnetoresistive sensor arrangements are used together with rotating motion sensor elements in diversified systems for detecting the number of revolutions of wheels, shafts or the like, coupled to the motion sensor elements. One of the most principal fields of application is their use in anti-blocking systems or as crankshaft rotational sensors in motor vehicles. The sensor arrangement is then conventionally operated in front of a gear wheel of a magnetizable material, with four resistors connected in a Wheatstone bridge configuration as described in the opening paragraph, in which the measuring direction, i.e. the magnetically sensitive direction of the sensor arrangement is parallel to the rotational direction co-ordinate of the gear wheel in the manner described.

As described, the output signal of the Wheatstone bridge can be represented in a first approximation by a sinusoidal signal on the motion co-ordinate of the motion sensor element, in which the zero-crossings in the output signal occur before the center of a tooth or before the center of a gap between two teeth of the motion sensor element. In the case of a moved motion sensor element, the position of the motion sensor element with respect to the sensor element can be unambiguously determined from the output signal.

An example of such an arrangement for measuring the rotational speed of a rotating motion sensor element with a sensor arrangement of the type described in the opening paragraph is shown diagrammatically in FIG. 1. In this Figure, the magnetoresistive sensor arrangement comprises four sensor elements 1, 2, 3, 4 which, in the manner described, comprise permalloy strips arranged on a silicon substrate in a meandering pattern and configured as a Wheatstone bridge. This Wheatstone bridge is arranged between a first power supply terminal 5, to which a first power supply potential UB is applied in operation, and a second power supply terminal 6, to which a second power supply potential M, preferably ground potential, is applied in operation. In the example shown, the sensor arrangement is planar arranged in a plane subtended by the x co-ordinate axis and the y co-ordinate axis of a Cartesian system of co-ordinates, to which plane a z co-ordinate axis is perpendicular. This magnetoresistive sensor arrangement is denoted in its entirety by the reference numeral 7.

Furthermore, a rectangular permanent magnet, referred to as working magnet 8, is mounted on the sensor arrangement 7. In a practical embodiment, this working magnet 8 is preferably stuck to the rear side of the sensor arrangement 7 or its housing so that the sensor arrangement 7 is permeated by the magnetic field H of the working magnet 8. The principal direction of the field lines of this magnetic field H extends along the z co-ordinate axis.

The magnetoresistive sensor arrangement 7 has a measuring direction along the y co-ordinate axis. Along this measuring direction, it is sensitive to the polarity and the field strength of an external magnetic field and is adapted to supply a measuring signal in dependence upon a field component of this magnetic field, denoted as measuring field and measured in the measuring direction. For operation, the external magnetic field is preferably and exclusively formed by the magnetic field H of the working magnet 8.

To measure the rotational speed of a rotating motion sensor element by means of the sensor arrangement 7 described hereinbefore, such a rotating motion sensor element 9 is positioned in front of the sensor arrangement 7 in the direction of the z co-ordinate axis. The motion sensor element 9 is formed from a ferromagnetic material in a gear wheel-shaped configuration and, in operation, rotates in the direction of a motion co-ordinate Φ. Along the motion co-ordinate Φ of the motion sensor element 9, this leads to a distortion of the field lines of the magnetic field H of the working magnet 8 in the measuring direction of the sensor arrangement 7, situated in the direction of the y co-ordinate axis, which distortion occurs periodically with respect to the distance between the teeth of the gear wheel-like shape of the motion sensor element 9. The field component of the magnetic field H of the measuring direction situated in the direction of the y co-ordinate axis is denoted as measuring field. In the sensor arrangement 7, the measuring field generates a preferably at least substantially sinusoidal output signal UA via the motion co-ordinate Φ, which signal is dependent on this motion co-ordinate Φ of the motion sensor element 9.

Figure 2:
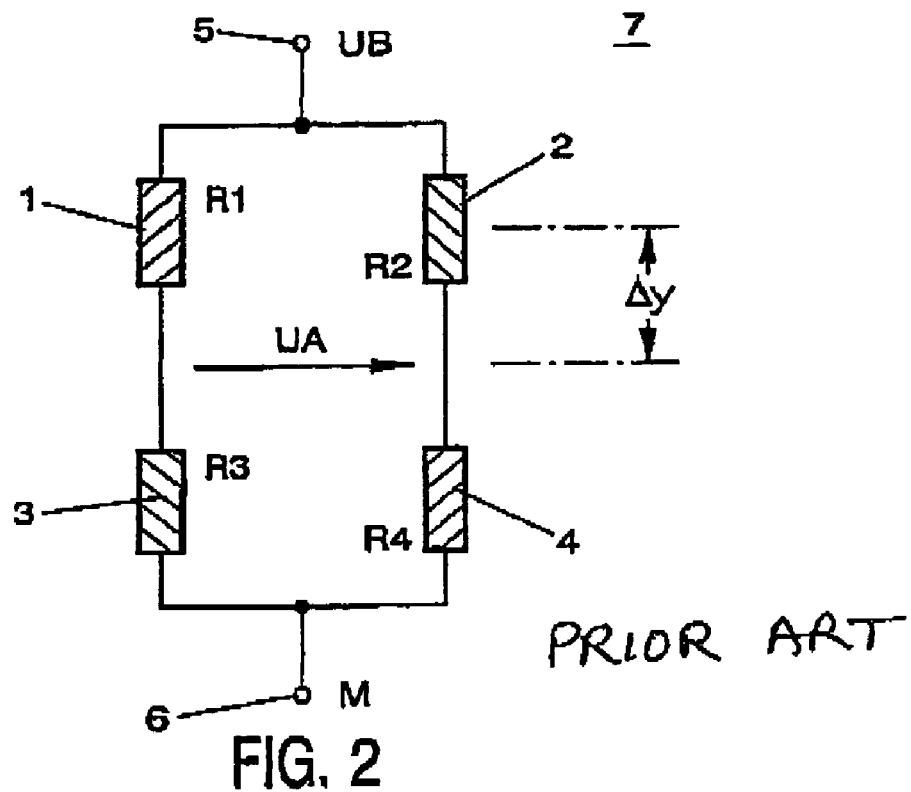

For further elucidation, FIG. 2 shows a circuit diagram of the sensor arrangement 7 of FIG. 1, in which corresponding elements are denoted by the same reference numerals. Different shaded areas of the individual sensor elements 1, 2, 3, 4 indicate that they are formed with barberpole structures, in which the alignments of the barberpole structures with respect to the directions of the electric current flowing through the sensor elements 1, 2, 3 and 4, produced by the power supply potential UB, are indicated by the directions of the slanting lines. The choice of the barberpole structures of the sensor elements 1, 2, 3, 4 is made in such a way that the resistances R1 and R4 of the first and the fourth sensor element 1 and 4 are increased by the positive value of the magnetic field strength of the measuring field, and that the resistances R2 and R3 of the second and the third sensor element 2 and 3 are reduced by the positive value of the magnetic field strength of the magnetic field. To this end, the angle $\alpha_i$ of the direction of the current through the sensor element i at a vanishing measuring field $H_i$ at the location of the sensor element i, with i=1, 2, 3, 4 is chosen to be as follows:

$$\alpha_1=+45°, \alpha_2=-45°, \alpha_3=-45°, \alpha_4=+45°.$$

Figure 3:
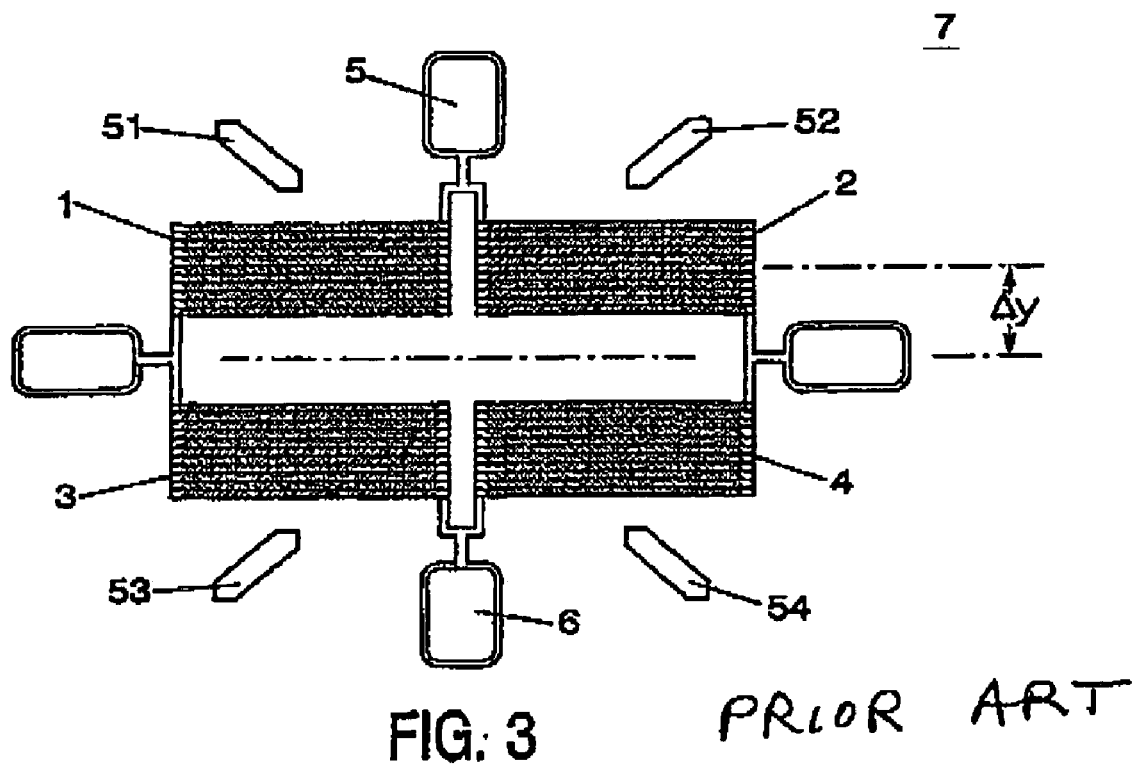

FIG. 3 shows a possible spatial form of the sensor arrangement 7, shown in FIG. 2, in a plan view on the plane subtended by the x co-ordinate axis and the y co-ordinate axis. The barberpole structures are shown diagrammatically and, for the sake of clarity, their alignments in the individual sensor elements 1, 2, 3, 4 are represented by symbols 51, 52, 53, 54 shown next to the individual sensor elements 1, 2, 3, 4, respectively.

For the measuring field at the location of the individual sensor elements i=1, 2, 3, 4, it holds in a first approximation:

$$H_i = H_{off\,i} + H_{pk} \sin(n\phi - n y_i/r) + H_{ex}$$

Herein:

$H_i$ is the magnetic field strength of the measuring field at the sensor element i with the resistance $R_i$ $H_{off\,i}$ is the offset part of the magnetic field strength of the measuring field at the sensor element i, caused, for example, by inhomogeneities of the measuring field along the measuring direction and being, for example, dependent on the distance between the motion sensor element 9 and the sensor arrangement 7 in the direction of the z co-ordinate axis, $H_{pk}$ is the amplitude of the magnetic field strength of the measuring field at the sensor element i n is the number of teeth on the motion sensor element 9 formed as a sensor wheel Φ is the motion co-ordinate of the motion sensor element 9 (for example, crankshaft angle of rotation)

r is the radius of the motion sensor element 9 formed as a sensor wheel $y_i$ is the co-ordinate of the sensor element i along the y co-ordinate axis (preferably the center of the spatial extension of the sensor element i along the y co-ordinate axis extending in the measuring direction)

$H_{ex}$ is the magnetic field strength of an external magnetic field superimposed throughout the plane of the sensor arrangement 7, particularly an interference field, at the sensor element i i is the index with i=1, 2, 3, 4

The following relation applies to the resistances $R_i$ of the individual sensor elements i:

$$Ri = R_0 + SH_i$$

or $$Ri = R_0 - SH_i$$

wherein $R_o$ is the resistance of the individual sensor elements i at the working point, i.e. at a vanishing measuring field $H_i$, S is the resistance change of the resistances Ri in dependence upon the measuring field, i.e. the slope of the R-H characteristic curve of the sensor elements i or the sensitivity of the sensor elements i, and i is the index with i=1, 2, 3, 4. and the sign before the second addend in these equations depends on the choice of the angle $\alpha_i$ of the direction of the current through the sensor element i at a vanishing measuring field $H_i$ at the location of the sensor element i, with i=1, 2, 3, 4, i.e. dependent on the choice of the alignment of the barberpole structures regarding the electric currents flowing through the sensor elements 1, 2, 3, 4.

For the resistances R1, R2, R3, R4 of the individual sensor elements 1, 2, 3, 4 of the sensor arrangement 7 of FIG. 2, the result is:

$$R1 = R_0 + S(H_{off1} + H_{pk} \sin(n\phi - n^*y_1/r) + H_{ex})$$

$$R2 = R_0 - S(H_{off2} + H_{pk} \sin(n\phi - n^*y_2/r) + H_{ex})$$

$$R3 = R_0 - S(H_{off3} + H_{pk} \sin(n\phi - n^*y_3/r) + H_{ex})$$

$$R4 = R_0 + S(H_{off4} + H_{pk} \sin(n\phi - n^*y_4/r) + H_{ex})$$

In accordance with FIG. 2, the relation $$y_1 = y_2 = -y_3 = -y_4 = \Delta y$$

applies to the co-ordinates $y_1$, $y_2$, $y_3$ and $y_4$ of the sensor elements 1, 2, 3, 4 in the case of an assumed symmetrical construction of the sensor arrangement 7 regarding the x co-ordinate axis, and under the same assumption for the offset parts $H_{Off\,i}$ of the magnetic field strength of the measuring field:

$$H_{Off1} = H_{Off2} = -H_{Off3} = -H_{Off4} = H_{Off}$$

The output signal UA of the sensor arrangement 7 results in a first approximation in:

$$UA/UB = R3/(R1+R3) - R4/(R2+R4) = -(S^*H_{pk}/R_0)\sin(n\phi)\cos(n\Delta y/r) - S^*H_{ex}/R_0$$

This equation shows that, on the one hand, the offset part of the magnetic field strength of the measuring field at the sensor elements 1, 2, 3, 4 does not have any influence on the output signal UA, but that an external field $H_{ex}$ in its full extent influences the output signal UA.

When such a sensor arrangement is used in an ambience in which such an external magnetic field occurs, interferences in the measurement performed by the sensor arrangement are produced, because said field part $H_{ex}$ is superimposed as an interference field on the output signal UA. Such a case occurs, for example, when using a sensor as a crankshaft rotation sensor for motor vehicles in which particularly the starter currents may produce considerable external magnetic fields.

In such an ambience, the use of a sensor arrangement of the type described leads to unacceptable limitations of its operating capacity.

It is an object of the invention to provide a sensor arrangement which, with simple means, ensures a reliable operation, also under said complicated conditions, and thus has a great freedom from interference.

According to the invention, this object is solved by a sensor arrangement comprising at least two half bridges which are coupled together to form at least a Wheatstone bridge, which sensor arrangement comprises at least two magnetoresistive sensor elements in each half bridge, said sensor elements being sensitive along a measuring direction to the magnetic field strength of an applied magnetic field and being adapted to supply a measuring signal in dependence upon a field component of the magnetic field, denoted as measuring field and measured in the measuring direction, at least two of the sensor elements in each half bridge comprising barberpole structures having a mutually different alignment, and the co-ordinates of the sensor elements of at least one of the half bridges and the co-ordinates of the sensor elements of at least another one of the half bridges being chosen to be different to a predetermined extent along an axis of co-ordinates extending in the measuring direction. The co-ordinate of a sensor element describes the position of a spatial reference point at this sensor element along said axis of co-ordinates, preferably the location of a center of the spatial extension of the relevant sensor element in the direction of this axis of co-ordinates.

The invention is based on the recognition that the amplitude of the magnetic field strength of the measuring field at the individual sensor elements changes with the co-ordinates of the sensor element, but that an external magnetic field, particularly an interference field extends at least substantially homogeneously in the area of the spatial extension of the sensor arrangement. By combination with the right sign of output signals of at least two half bridges, in which the sensor elements have different co-ordinates, the influence of the external magnetic field on the output signal of the sensor arrangement can at least substantially be eliminated. The co-ordinates may be determined differently from half bridge to half bridge but also from sensor element to sensor element within at least one of the half bridges. A kind of "geometrical subtraction" of the unwanted external fields is thereby obtained.

In this respect, it is to be noted that a sensor chip is known from EP-A 0 607 595 which is particularly used for current and voltage measurement with a bridge circuit configured as a Wheatstone bridge for measuring gradients of the magnetic field strength and consists of four magnetoresistive resistors which are parallel arranged in two areas, at a distance from a central axis. Of these resistors, two series-arranged resistors constitute a branch of the Wheatstone bridge in which the two said areas comprise a magnetoresistive resistor of one bridge branch and a magnetoresistive resistor of the other bridge branch. The resistors of the two areas are arranged symmetrically with respect to the central axis. They consist of two coated strips which are mutually parallel and are parallel to the other strips, and are provided with barberpole structures. These barberpole structures are equal for all resistors, thus ensuring that only one applied field gradient controls the bridge. As the distance between the two areas, i.e. the basic length of the gradiometer is maintained small in this sensor chip, the influence of interfering magnetic fields, whose sources are at a larger distance from the measuring arrangement, is insignificant in accordance with the embodiments described in EP-A 0 607 595.

Figure 4:
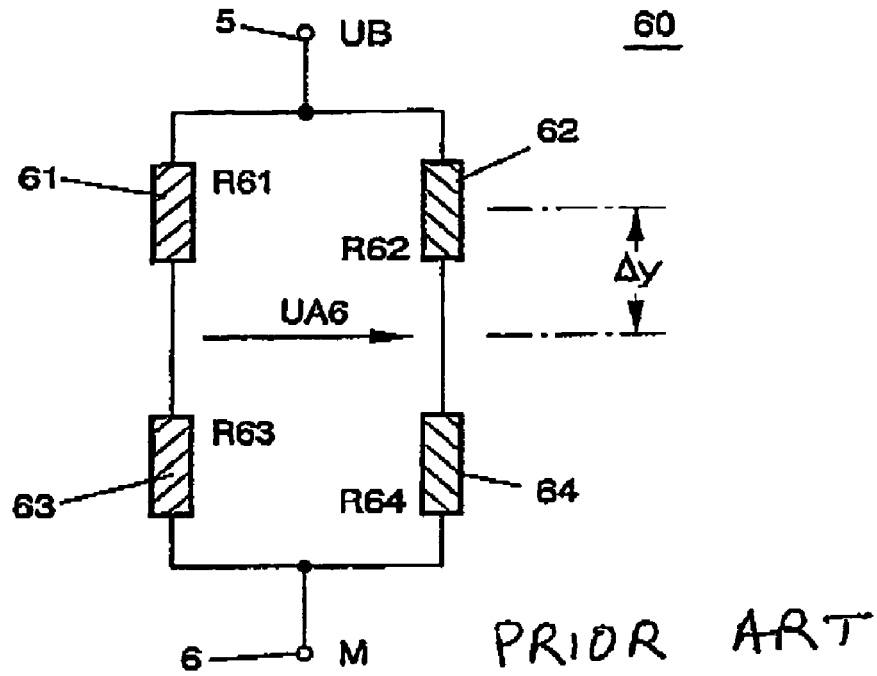

An example of such a sensor arrangement referred to as gradient sensor 60 for measuring gradients of the magnetic field strength is shown by way of a circuit diagram in FIG. 4 in which elements corresponding to elements already described are denoted by the same reference numerals. The sensor arrangement of FIG. 4 which can be used in the arrangement of FIG. 1 instead of the arrangement of FIG. 2, comprises a first, second, third and fourth sensor element 61, 62, 63 and 64 arranged in a Wheatstone bridge configuration. The bridge circuit is again connected via the power supply terminals 5, 6 to a power supply which, likewise as in FIGS. 1 and 2, results from the difference between the power supply potentials UB, M. An output signal UA6 is taken from the half bridges 61, 63 and 62, 64.

Also in FIG. 4, different shaded areas representing the individual sensor elements 61, 62, 63, 64 indicate that they are formed with barberpole structures, in which the alignments of the barberpole structures regarding the directions of electric currents produced by the power supply potential UB and flowing through the sensor elements 61, 62, 63 and 64 are indicated by the directions of the slanting lines. The choice of the barberpole structures of the sensor elements 61, 62, 63, 64 is, however, made in such a way that the resistances R61 and R63 of the first and the third sensor element 61 and 63, respectively, are increased by the positive value of the magnetic field strength of the measuring field, and that the resistances R62 and R64 of the second and the fourth sensor element 62 and 64, respectively, are reduced by the positive value of the magnetic field strength of the measuring field. To this end, the angle $\alpha_i$ of the direction of the current through the sensor element i at a vanishing measuring field $H_i$ at the location of the sensor element i, with i=61, 62, 63, 64 is chosen to be as follows:

$$\alpha_{61}=+45°, \alpha_{62}=-45°, \alpha_{63}=+45°, \alpha_{64}=-45°.$$

Figure 5:
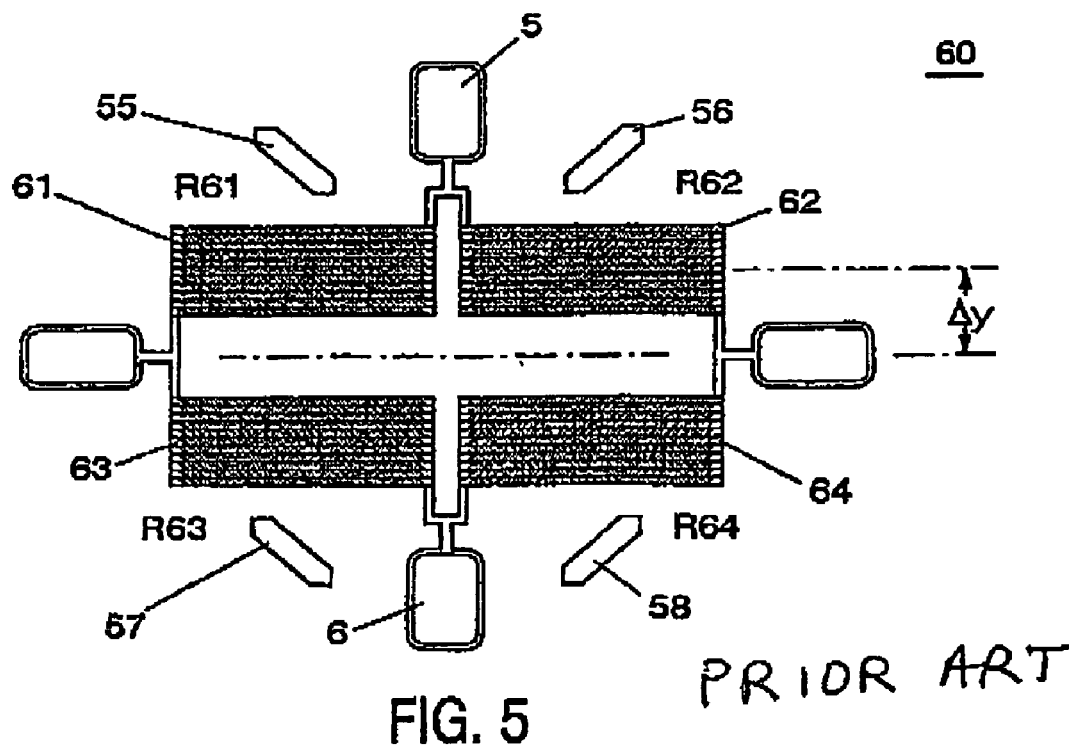

FIG. 5 shows a possible spatial form of the sensor arrangement 60, shown in FIG. 4, in a plan view on the plane subtended by the x co-ordinate axis and the y co-ordinate axis. The barberpole structures are shown diagrammatically again and, for the sake of clarity, their alignments in the individual sensor elements 61, 62, 63, 64 are represented by symbols 55, 56, 57 and 58 shown next to the individual sensor elements 61, 62, 63 and 64, respectively.

Under conditions otherwise corresponding to those in FIGS. 2 and 3, the following output signal UA6 of this gradient sensor 60 is obtained in a first approximation:

$$UA6/UB = R63/(R61+R63) - R64/(R62+R64) = -S^*H_{Off}/R_0 + (S^*H_{pk}/R_0)\cos(n\phi)\sin(n\Delta y/r)$$

It can be seen that by using this gradient sensor 60, the influence of external magnetic fields and thus also external interference fields can be eliminated at least in a first approximation, but that the influence of the offset parts of the magnetic field strength of the measuring field remains on the sensor elements. These offset parts of the magnetic field strength of the measuring field on the sensor elements also prove to be dependent on the distance between the sensor arrangement 60 and the motion sensor element 9 along the z co-ordinate axis. The resultant limitations of the output signal UA6 are not acceptable for a flawless operation of the sensor arrangement 60. Moreover, the output signal UA6 of the gradient sensor has a maximum when a tooth of the rotating motion sensor element formed as a sensor wheel (gear wheel) is centered in front of the sensor arrangement, and a minimum when an indentation (i.e. a gap) between two teeth of the rotating motion sensor element formed as a sensor wheel (gear wheel) is centered in front of the sensor arrangement. An exact detection of these positions of the motion sensor element along its motion co-ordinate $\Phi$ can therefore only be carried out with great difficulty.

In contrast, the sensor arrangement according to the invention provides the simple possibility of a reliable operation which is free from any interference influences and supplies an output signal which can be accurately evaluated.

In a first, advantageous embodiment, the sensor arrangement according to the invention comprises four half bridges. Each time two of these half bridges may be configured as a Wheatstone bridge each supplying a partial output signal, from which partial output signals the output signal can be superimposed on the overall sensor arrangement.

The sensor elements of a first and a second of the four half bridges have predetermined first co-ordinates along the axis of co-ordinates extending in the measuring direction, and the sensor elements of a third and a fourth of the four half bridges have predetermined second co-ordinates along the axis of co-ordinates extending in the measuring direction. This provides a spatially separate location of two half bridges each, and the output signals supplied thereby are distinguished in accordance with these co-ordinates. The above-described "geometrical subtraction" of the unwanted external fields can thereby be realized as a superposition of the partial output signals. However, it should be noted that this represents only one of the possible embodiments and that four half bridges can also be configured as a Wheatstone bridge, such that a "geometrical subtraction" of the unwanted external fields is also realized in already each of these individual Wheatstone bridges.

Furthermore, the first co-ordinates of the sensor elements of the first and the second half bridge are mutually chosen to be at least substantially symmetrical to a reference point on the axis of co-ordinates extending in the measuring direction, the second coordinates of the sensor elements of the third and the fourth half bridge are mutually chosen to be at least substantially symmetrical to the reference point on the axis of co-ordinates extending in the measuring direction, and the values of the first co-ordinates are chosen to be different from the values of the second co-ordinates. This particularly results in a spatially interleaved arrangement of the half bridges. Moreover, simplifications in the dependence of the output signal of the sensor arrangement on the values of the co-ordinates are obtained.

When the values of the first co-ordinates of the sensor elements of the first and the second half bridge are chosen to be larger than the values of the second co-ordinates of the sensor elements of the third and the fourth half bridge, the sensor elements of the first and the second half bridge spatially comprise the sensor elements of the third and the fourth half bridge. Since, furthermore, the first and the second half bridge are coupled to form a first Wheatstone bridge and the third and the fourth half bridge are coupled to form a second Wheatstone bridge, the first Wheatstone bridge spatially comprises the second Wheatstone bridge. A further symmetry of the sensor arrangement and hence further simplifications in the dependence of the output signal of the sensor arrangement on the values of the co-ordinates can thus be achieved.

In a further, advantageous embodiment, the sensor arrangement according to the invention comprises two half bridges which are coupled to form a Wheatstone bridge. An essentially simpler and cheaper structure of the overall sensor arrangement is then obtained which, in this embodiment, needs to have only four external connections. Regardless of this, however, an output signal which is at least substantially independent of the influence of external magnetic fields and of the influence of offset parts of the magnetic field strength of the measuring field is obtained.

In the above-mentioned embodiment of the invention, the sensor elements of a first of the two half bridges have predetermined first co-ordinates along the axis of co-ordinates extending in the measuring direction, and the sensor elements of a second of the two half bridges have predetermined second co-ordinates along the axis of co-ordinates extending in the measuring direction. Furthermore, the first co-ordinates of the sensor elements of the first half bridge are mutually chosen to be at least substantially symmetrical to a reference point on the axis of co-ordinates extending in the measuring direction, the second co-ordinates of the sensor elements of the second half bridge are mutually chosen to be at least substantially symmetrical to the reference point on the axis of co-ordinates extending in the measuring direction, and the values of the first co-ordinates are chosen to be different from the values of the second co-ordinates. Moreover, the values of the first co-ordinates of the sensor elements of the first half bridge are chosen to be larger than the values of the second co-ordinates of the sensor elements of the second half bridge.

In these preferred further embodiments, the same properties and advantages as for the sensor arrangement with four half bridges are also obtained for the sensor arrangement with only two half bridges.

In practice, it is advantageous in the described arrangements to superimpose an additional magnetic field component in the direction of at least a further axis of co-ordinates which is at least substantially orthogonal to the measuring direction on the magnetic field of the working magnet which, in the ideal case, has only a magnetic field component at the location of the sensor arrangement along the direction here denoted as the z co-ordinate axis and has a deflection in the measuring direction due to the positioning of the sensor arrangement in front of the motion sensor element. This direction is preferably constituted by the x co-ordinate axis in the arrangements shown. This additional magnetic field component, preferably in the direction of the x co-ordinate axis, is also denoted as supporting field of the sensor arrangement. In the case of a reversal of the direction (i.e. a reversed sign of the magnetic field strength) of this additional magnetic field component, it appears that the characteristic curve of the sensor arrangement, particularly the relationship between the measuring field and the motion co-ordinate of the motion sensor element and the output signal of the sensor arrangement, is inverted. Since such an inversion of the characteristic curve no longer ensures a correct evaluation of the output signal of the sensor arrangement, the sensor arrangement cannot do without such a supporting field during operation.

Of course, the case may occur that the described supporting field within the spatial area covered by the sensor arrangement, i.e. along the x co-ordinate axis in the arrangements described, has divergencies, i.e. is inhomogeneous. Along this x co-ordinate axis, sensor elements of the sensor arrangement situated at different co-ordinates are also subjected to different field strengths of the supporting field, which leads to different sensitivities of these sensor elements regarding the measuring field.

In a further improvement, particularly of the embodiment of the invention formed with two half bridges, the sensor elements have at least substantially corresponding co-ordinates in the direction of at least a further axis of co-ordinates which is at least substantially orthogonal to the measuring direction. Such an improvement may also be advantageous for the embodiment of the invention formed with four half bridges.

Particularly, the further axis of co-ordinates which is at least substantially orthogonal to the measuring direction is aligned at least substantially orthogonally to the main direction of the field lines of the applied magnetic field.

The sensitivities of the sensor elements of the different half bridges as regards the measuring field are thus matched so that the robustness of the sensor arrangement to external magnetic fields, and hence also to external interference fields, is clearly improved.

These and other aspects of the invention are apparent from and will be elucidated with reference to the embodiments described hereinafter.

Figure 6:
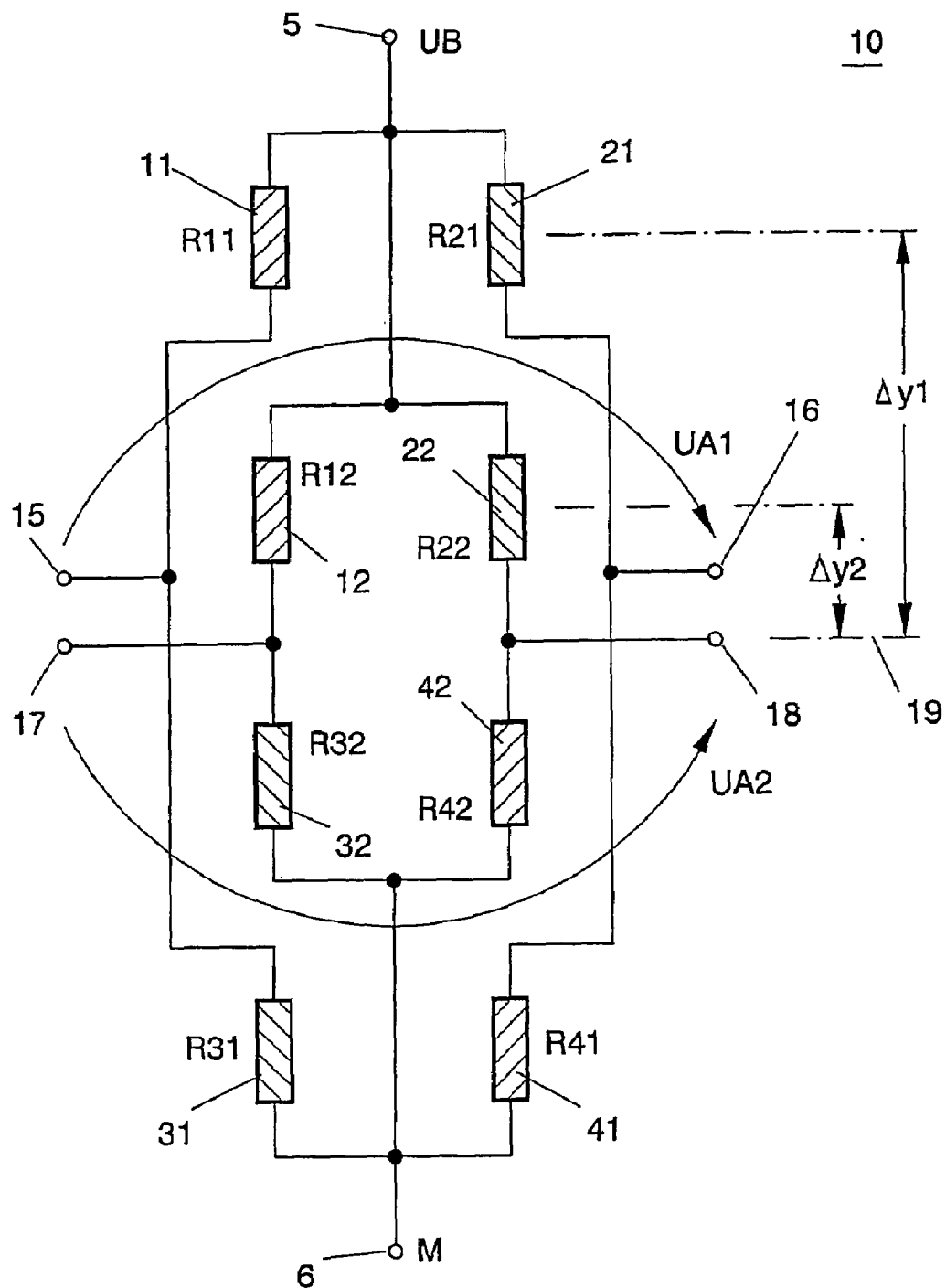
Figure 7:
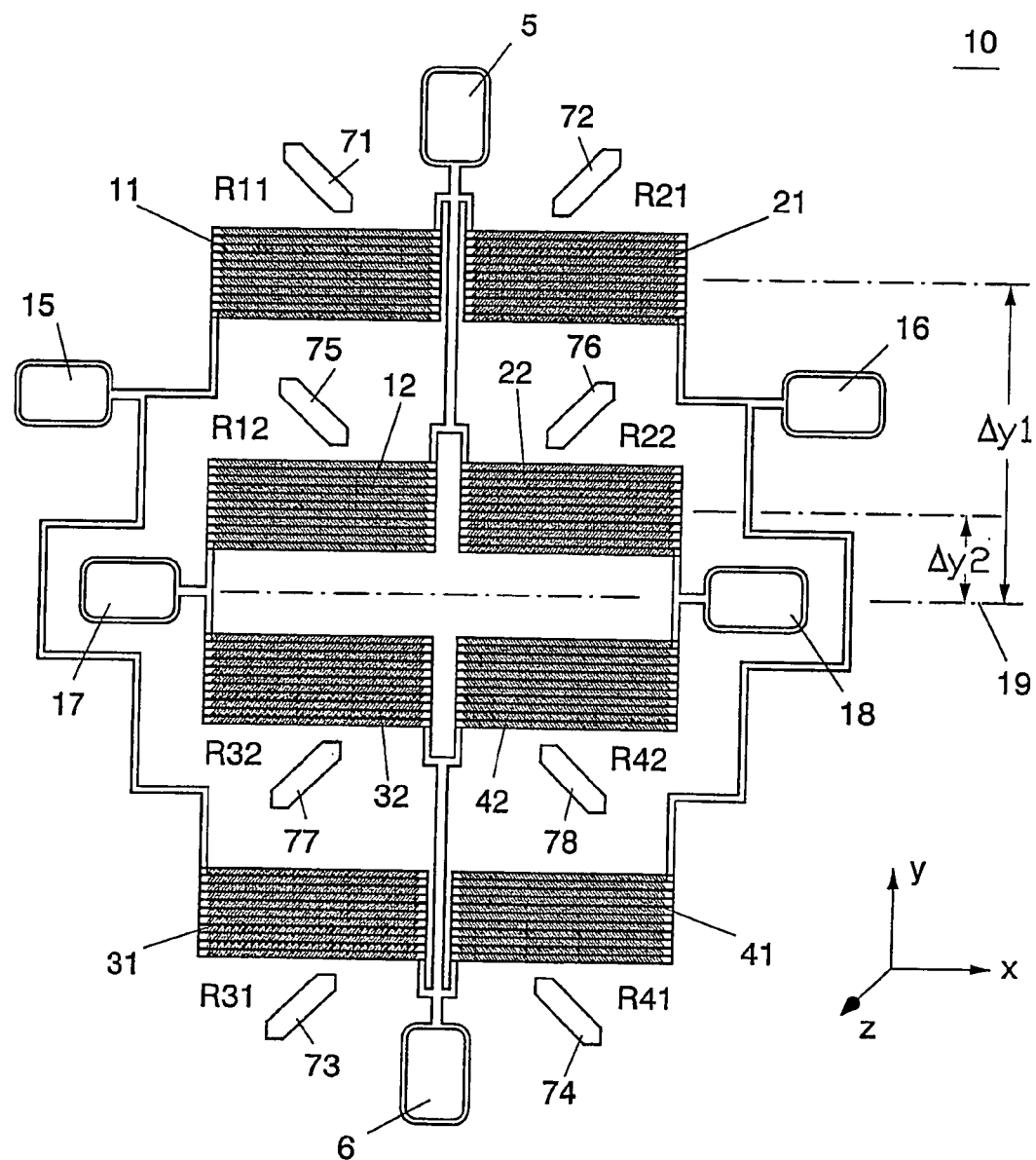
Figure 8:
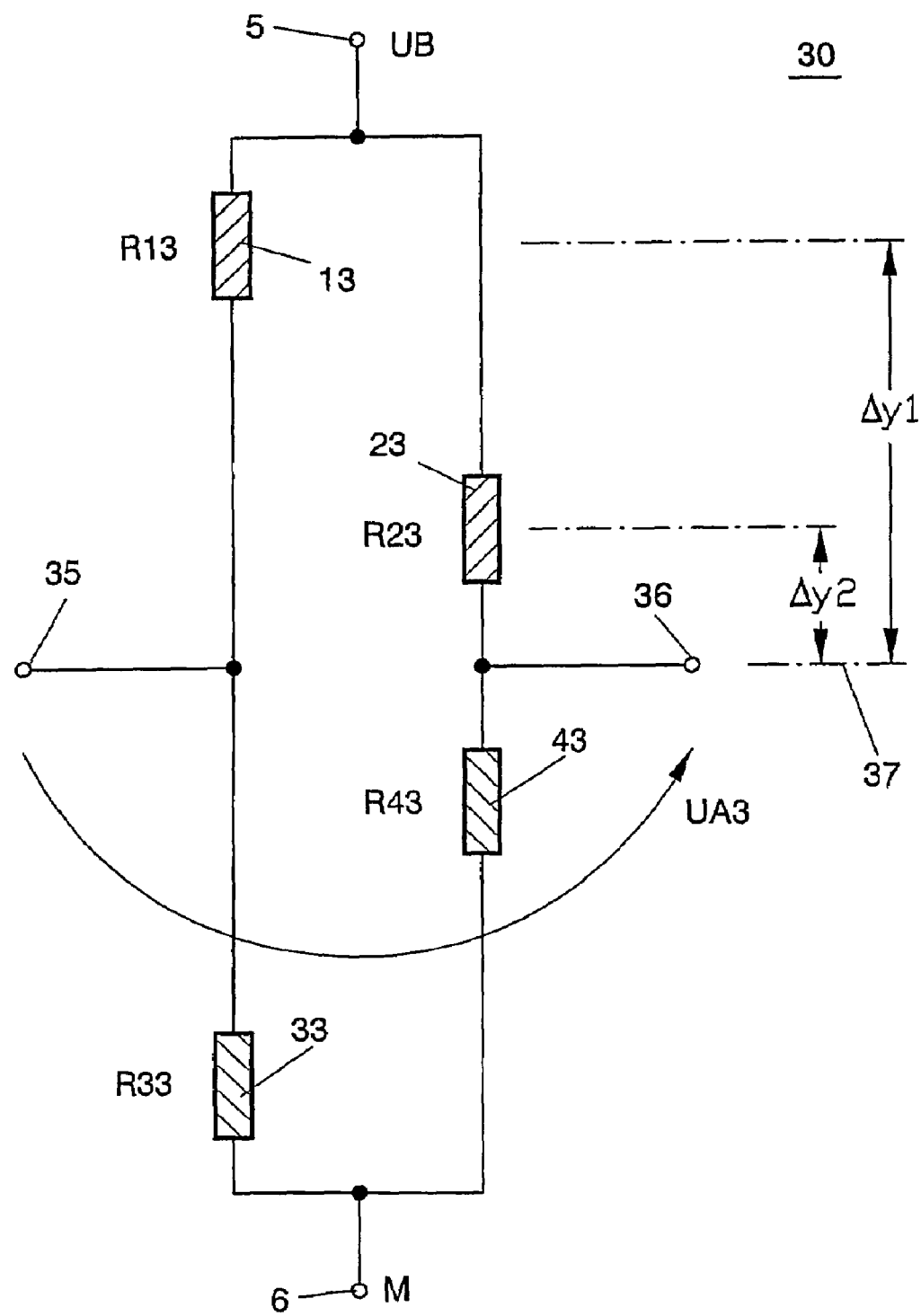
Figure 9:
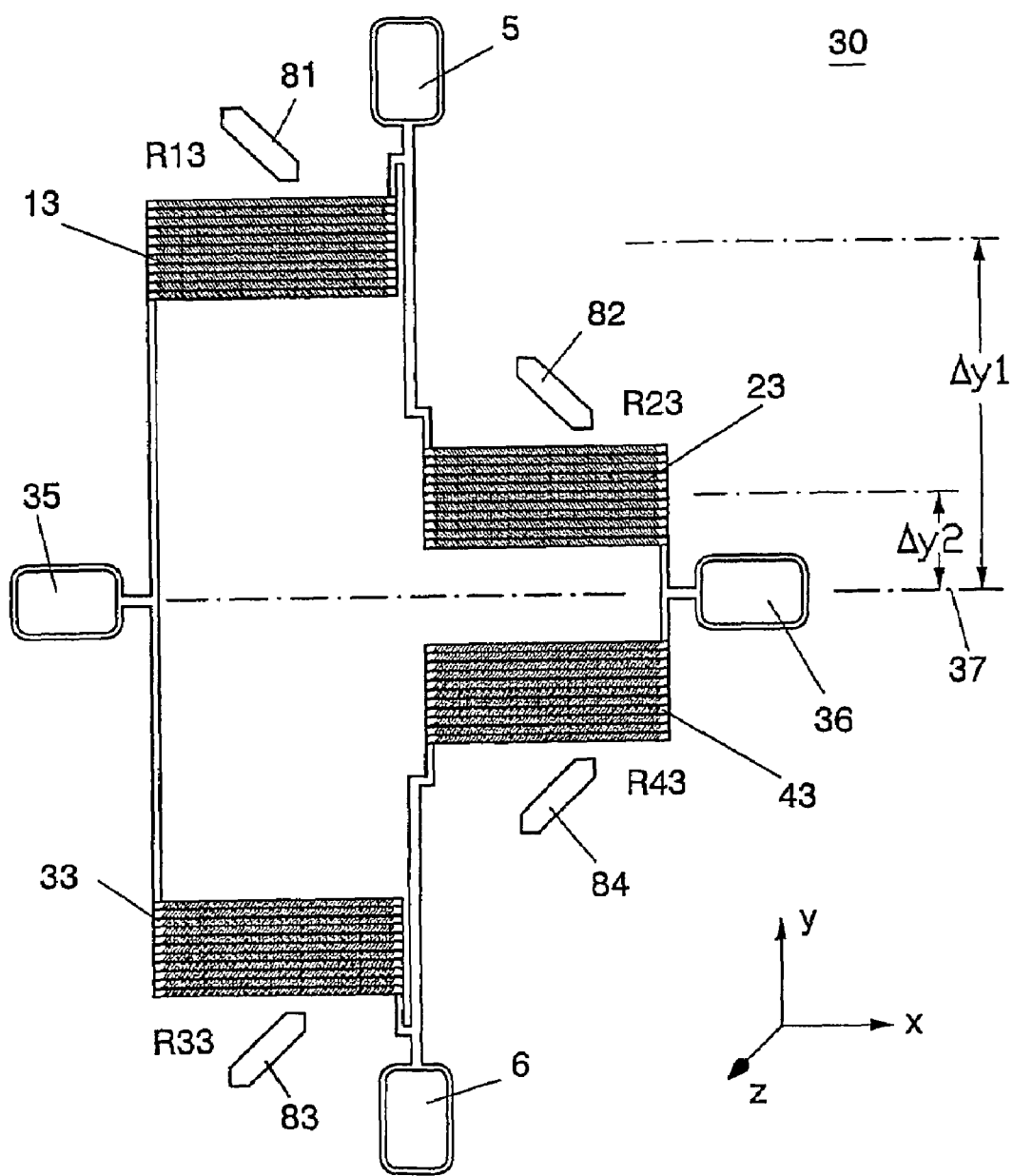
Figure 10:
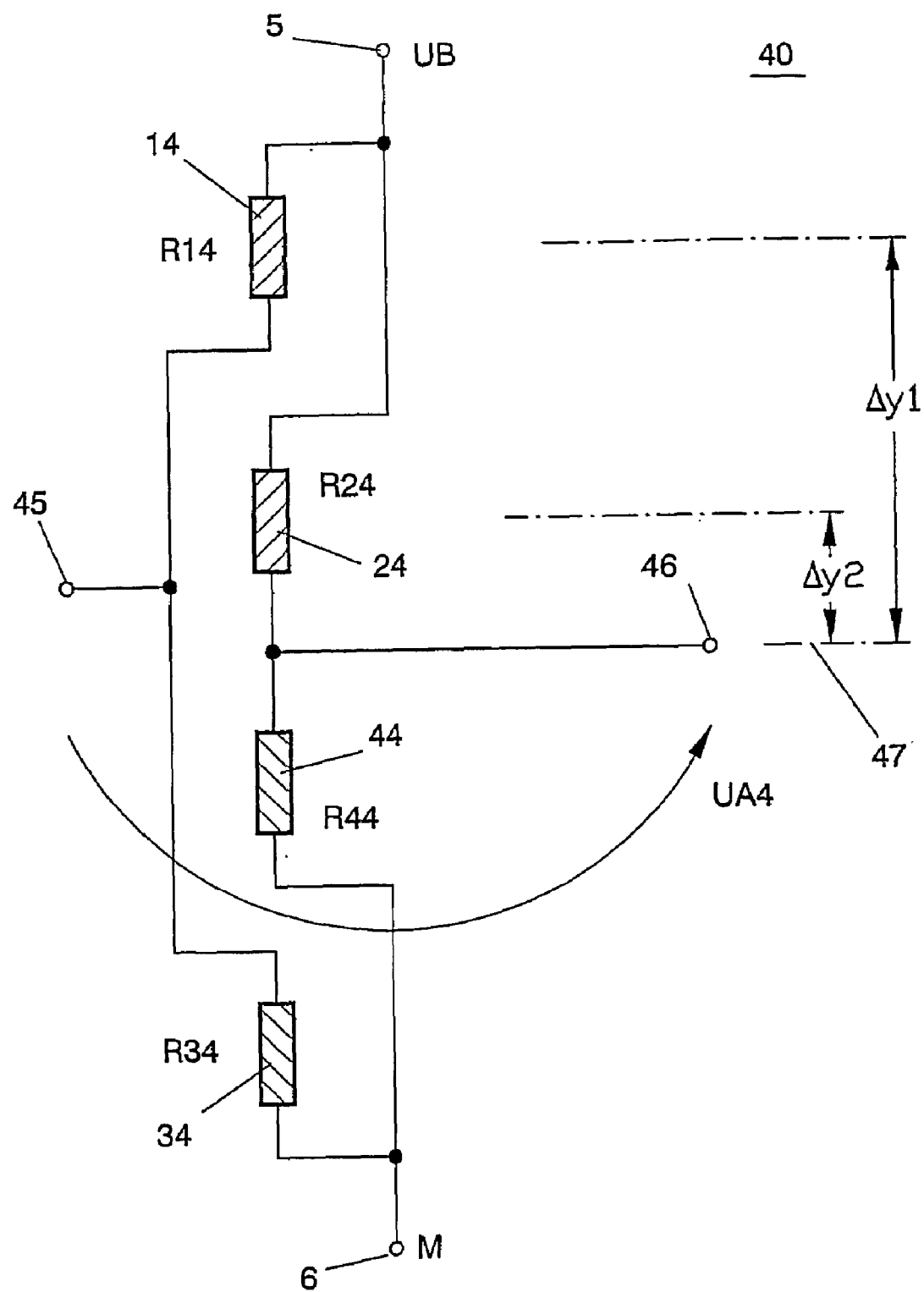
Figure 11:
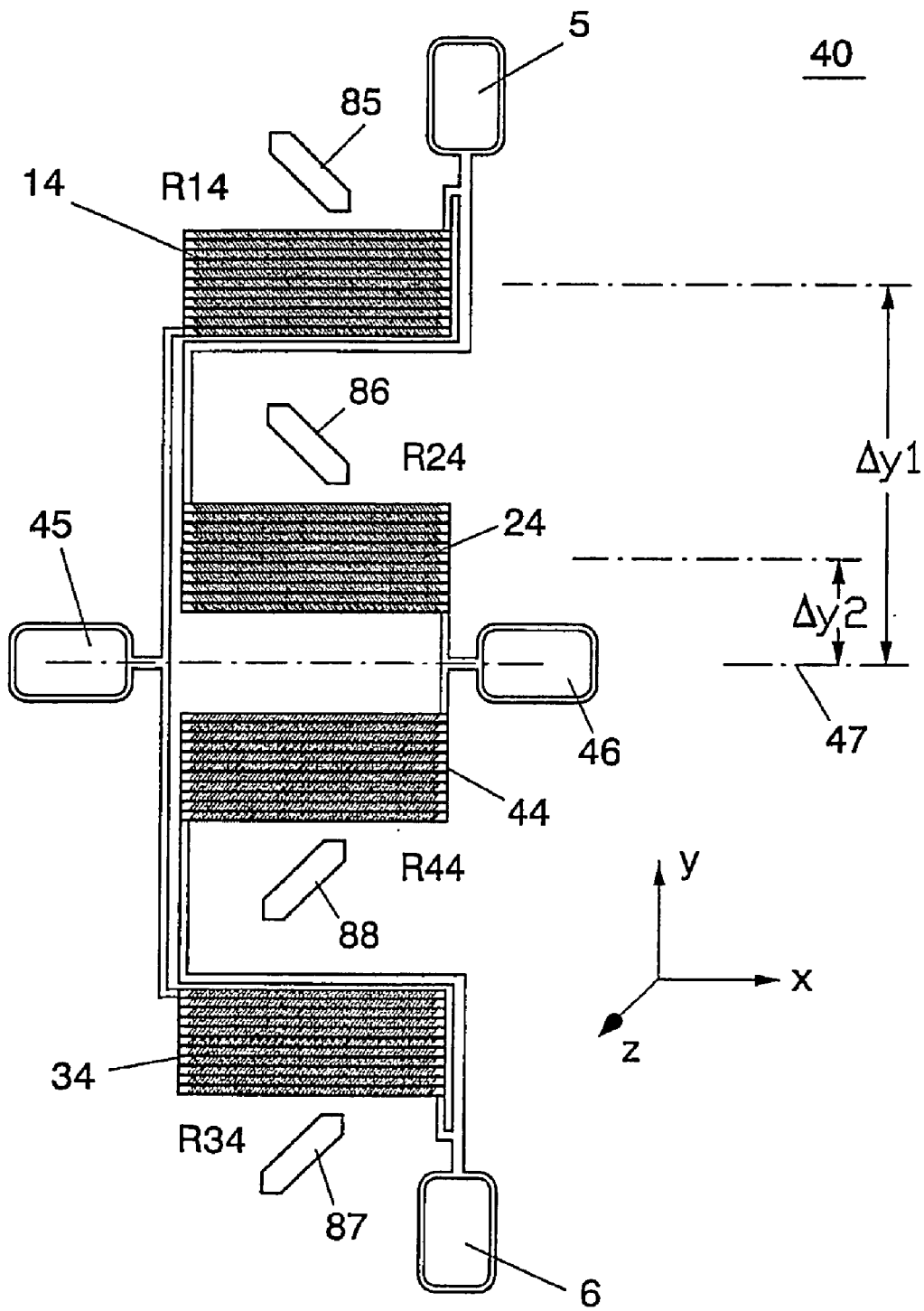

In the drawings:

FIG. 1 shows an example of an arrangement for measuring the rotational speed of a rotating motion sensor element, FIG. 2 is a circuit diagram of a sensor arrangement shown in FIG. 1, FIG. 3 is a possible spatial implementation of the sensor arrangement of FIG. 2, FIG. 4 shows an example of a gradient sensor in a circuit diagram, FIG. 5 is a possible spatial implementation of the gradient sensor of FIG. 4, FIG. 6 is a circuit diagram of a first embodiment of the invention, FIG. 7 is an example of a spatial implementation of the first embodiment of the invention, shown in FIG. 6, FIG. 8 is a circuit diagram of a second embodiment of the invention, FIG. 9 is an example of a spatial implementation of the second embodiment of the invention, shown in FIG. 8, FIG. 10 is a circuit diagram of a third embodiment of the invention, and FIG. 11 is an example of a spatial implementation of the third embodiment of the invention, shown in FIG. 10.

The embodiment in FIG. 6 shows a sensor arrangement 10 comprising a first Wheatstone bridge built up of a first, a second, a third and a fourth sensor element 11, 21, 31 and 41, respectively, of which the first and the third sensor element 11, 31, on the one hand, and the second and the fourth sensor element 21, 41, on the other hand, are arranged in series and connected to form a half bridge each. The sensor arrangement 10 further comprises a second Wheatstone bridge built up of a fifth, a sixth, a seventh and an eighth sensor element 12, 22, 32 and 42, respectively, of which the fifth and the seventh sensor element 12, 32, on the one hand, and the sixth and the eighth sensor element 22, 42, on the other hand, are also arranged in series and connected to form a half bridge each. These half bridges 11, 31; 21, 41; 12, 32; 22, 42 are arranged between a first power supply terminal 5, which preferably conveys a power supply potential UB, and a second power supply terminal 6, which preferably conveys ground potential M.

The junction point between the first and the third sensor element 11, 31 is connected to a first tap 15 on the first Wheatstone bridge of the magnetoresistive sensor arrangement 10. In a corresponding manner, the junction point between the second and the fourth sensor element 21, 41 is connected to a second tap 16 on the first Wheatstone bridge of the magnetoresistive sensor arrangement 10. Furthermore, the junction point between the fifth and the seventh sensor element 12, 32 is connected to a third tap 17 on the second Wheatstone bridge of the magnetoresistive sensor arrangement 10, and the junction point between the sixth and the eighth sensor element 22, 42 is connected to a fourth tap 18 on the second Wheatstone bridge of the magnetoresistive sensor arrangement 10. A first output signal UA1 of the first Wheatstone bridge of the magnetoresistive sensor arrangement 10 is taken between the first and the second tap 15 and 16, and a second output signal UA2 of the second Wheatstone bridge of the magnetoresistive sensor arrangement 10 is taken between the third and the fourth tap 17 and 18.

The first, second, third, fourth, fifth, sixth, seventh and eighth sensor elements 11, 21, 31, 41, 12, 22, 32 and 42 of the magnetoresistive sensor arrangement 10 have resistances R11, R21, R31, R41, R12, R22, R32 and R42, respectively.

The sensor elements 11, 21, 31, 41 of the first Wheatstone bridge of the magnetoresistive sensor arrangement 10 are positioned, along a y co-ordinate axis with a first co-ordinate $\Delta y1$ having corresponding values for all of these sensor elements, symmetrically to a spatial central axis 19 extending along an x co-ordinate axis in a plane subtended by these x and y co-ordinate axes. The sensor elements 12, 22, 32, 42 of the second Wheatstone bridge of the magnetoresistive sensor arrangement 10 are positioned, along the y co-ordinate axis with a second co-ordinate $\Delta y2$ having corresponding values for all of these sensor elements, symmetrically to the spatial central axis 19 in the same plane. The value of the first co-ordinate $\Delta y1$ is chosen to be larger than the value of the second co-ordinate $\Delta y2$. The two Wheatstone bridges are thereby spatially arranged in an interleaved configuration along the y co-ordinate axis.

The first, second, third, fourth, fifth, sixth, seventh and eighth sensor elements 11, 21, 31, 41, 12, 22, 32 and 42 of the magnetoresistive sensor arrangement 10 are formed with barberpole structures. The alignment of these barberpole structures in the individual sensor element is shown in FIGS. 2 and 4 by way of a shaded area in the form of slanting lines. Accordingly, the following values are chosen for the angles $\alpha_i$ of the direction of the current through the sensor element i upon a vanishing measuring field $H_i$ at the location of the sensor element denoted by i=11, 21, 31, 41 and 12, 22, 32, 42 in FIG. 6:

$$\alpha_{11}=+45°, \alpha_{21}=-45°, \alpha_{31}=-45°, \alpha_{41}=+45°, \alpha_{12}=+45°,$$
$$\alpha_{22}=-45°, \alpha_{32}=-45°, \alpha_{42}=+45°,$$

FIG. 7 shows a possible spatial implementation of the sensor arrangement 10 of FIG. 6 in a plan view on the plane subtended by the x co-ordinate axis and the y co-ordinate axis. The barberpole structures are shown again diagrammatically and, for the sake of clarity, their alignments in the individual sensor elements 11, 21, 31, 41, 12, 22, 32 and 42 are represented by symbols 71, 72, 73, 74, 75, 76, 77 and 78 shown next to these individual sensor elements 11, 21, 31, 41, 12, 22, 32 and 42, respectively.

The output signals in the sensor arrangement 7 shown in FIG. 2 can be determined for the first and the second Wheatstone bridge of the sensor arrangement 10 of FIG. 6. The relations for the measuring field at the location of the individual sensor elements i are, in a first approximation:

$$H_i = H_{Off} + H_{pk} \sin(n\phi - n\, y_i/r) + H_{ex}$$

In a manner corresponding to FIGS. 2 and 3:

$H_{Off}$ is the offset part of the magnetic field strength of the measuring field at the sensor element i, $y_i$ is the co-ordinate of the sensor element i and i is the index with i=11, 21, 31, 41, 12, 22, 32, 42.

The following relation holds for the resistances Ri of the individual sensor elements i:

$$Ri = R_0 + SH_i$$

or $$Ri = R_0 - SH_i,$$

in which the sign before the second addend in these equations again depends on the choice of the angles $\alpha_i$ of the direction of the current through the sensor element i upon a vanishing measuring field $H_i$ at the location of the sensor element i, with i=11, 21, 31, 41, 12, 22, 32, 42, i.e. dependent on the choice of the alignment of the barberpole structures regarding the electric currents flowing through the sensor elements 11, 21, 31, 41, 12, 22, 32 and 42.

The following resistances R11, R21, R31, R41 of the individual sensor elements 11, 21, 31, 41 are obtained for the first Wheatstone bridge of the sensor arrangement 10:

$$R11 = R_0 + S(H_{Off11} + H_{pk} \sin(n\phi - n^*y_{11}/r) + H_{ex})$$

$$R21 = R_0 - S(H_{Off21} + H_{pk} \sin(n\phi - n^*y_{21}/r) + H_{ex})$$

$$R31 = R_0 - S(H_{Off31} + H_{pk} \sin(n\phi - n^*y_{31}/r) + H_{ex})$$

$$R41 = R_0 + S(H_{Off41} + H_{pk} \sin(n\phi - n^*y_{41}/r) + H_{ex})$$

In a corresponding manner, the following resistances R12, R22, R32, R42 of the individual sensor elements 12, 22, 32, 42 are obtained for the second Wheatstone bridge of the sensor arrangement 10:

$$R12 = R_0 + S(H_{Off12} + H_{pk} \sin(n\phi - n^*y_{12}/r) + H_{ex})$$

$$R22 = R_0 + S(H_{Off22} + H_{pk} \sin(n\phi - n^*y_{22}/r) + H_{ex})$$

$$R32 = R_0 + S(H_{Off32} + H_{pk} \sin(n\phi - n^*y_{32}/r) + H_{ex})$$

$$R42 = R_0 + S(H_{Off42} + H_{pk} \sin(n\phi - n^*y_{42}/r) + H_{ex})$$

In accordance with FIGS. 6 and 7, the following relations hold for the co-ordinates $y_i$ of the sensor elements i for the assumed symmetrical structure of the sensor arrangement 10 regarding the x co-ordinate axis:

$$y_{11} = y_{21} = -y_{31} = -y_{41} = \Delta y1, \; y_{12} = y_{22} = -y_{32} = -y_{42} = \Delta y2;$$

and, under the same assumption, the following relations are obtained for the offset parts $H_{Offi}$ of the magnetic field strength of the measuring field for the individual Wheatstone bridges:

$$H_{Off11} = H_{Off21} = -H_{Off31} = -H_{Off41} = H_{Off}^1,$$
$$H_{Off12} = H_{Off22} = -H_{Off32} = -H_{Off42} = H_{Off}^2,$$

wherein $H_{Off}^1$ is the amount of the offset part of the magnetic field strength of the measuring field at the sensor elements 11, 21, 31, 41 (FIGS. 6, 7), $H_{Off}^2$ is the amount of the offset part of the magnetic field strength of the measuring field at the sensor elements 12, 22, 32, 42 (FIGS. 6, 7).

The first output signal UA1 of the first Wheatstone bridge of the magnetoresistive sensor arrangement 10 is then in a first approximation:

$$UA1/UB = R31/(R11+R31) - R41/(R21+R41) = -(S^*H_{pk}/R_0)\sin(n\phi)\cos(n^*\Delta y1/r) - S^*H_{ex}/R_0$$

In a corresponding manner, the second output signal UA2 of the second Wheatstone bridge of the magnetoresistive sensor arrangement 10 is in a first approximation:

$$UA2/UB = R32/(R12+R32) - R42/(R22+R42) = -(S^*H_{pk}/R_0)\sin(n\phi)\cos(n^*\Delta y2/r) - (S^*H_{ex}/R_0)$$

For the difference between the output signals UA1 and UA2 of the two Wheatstone bridges, the following relation is obtained in a first approximation:

$$(UA2-UA1)/UB = -(S^*H_{pk}/R_0)\sin(n\phi)[\cos(n^*\Delta y1/r) - \cos(n^*\Delta y2/r)]$$

The signal combined as the difference between the output signals UA1 and UA2 of the Wheatstone bridges is thus independent of an external field and therefore not influenced by interference fields. The sensor arrangement 10 shown in FIGS. 6, 7 thus has a high robustness against magnetic interference fields.

Instead of the shown combination of the individual half bridges configured as the first and the second Wheatstone bridge, the described half bridges may also be combined to Wheatstone bridges in a different configuration.

FIG. 8 shows a second embodiment of the invention with a sensor arrangement 30 which comprises only one Wheatstone bridge built up of a first, a second, a third and a fourth sensor element 13, 23, 33 and 43, of which the first and the third sensor element 13, 33, on the one hand, and the second and the fourth sensor element 23, 43, on the other hand, are arranged in series and connected to form a half bridge each. These half bridges 13, 33 and 23, 43 are arranged between a first power supply terminal 5, which preferably conveys a power supply potential UB again, and a second power supply terminal 6, which preferably conveys ground potential M again.

The junction point between the first and the third sensor element 13, 33 is connected to a first tap 35 on the magnetoresistive sensor arrangement 30 formed as a Wheatstone bridge. In a corresponding manner, the junction point between the second and the fourth sensor element 23, 43 is connected to a second tap 36 on the Wheatstone bridge. An output signal UA3 of the magnetoresistive sensor arrangement 30 is taken between the first and the second tap 35 and 36.

The first, second, third and fourth sensor elements 13, 23, 33 and 43 of the magnetoresistive sensor arrangement 30 have resistances R13, R23, R33 and R43, respectively.

The first and the third sensor element 13, 33 of the first half bridge of the magnetoresistive sensor arrangement 30 are positioned, along a y co-ordinate axis with a first co-ordinate $\Delta y1$ having corresponding values for these two sensor elements 13, 33, symmetrically to a spatial central axis 37 extending along an x co-ordinate axis in a plane subtended by these x and y co-ordinate axes. The sensor elements 23, 43 of the second half bridge of the magnetoresistive sensor arrangement 30 are positioned, along the y co-ordinate axis with a second co-ordinate $\Delta y2$ having corresponding values for these two sensor elements 23, 53, symmetrically to the spatial central axis 37 in the same plane. The value of the first co-ordinate $\Delta y1$ is chosen to be larger than the value of the second co-ordinate $\Delta y2$. The two half bridges 13, 33 and 23, 43 thus have different extensions spatially along the y co-ordinate axis.

Also in the sensor arrangement of this embodiment, the first, second, third and fourth sensor elements 13, 23, 33 and 43 of the magnetoresistive sensor arrangement 30 are formed with barberpole structures. The alignment of these barberpole structures in the individual sensor elements is again indicated by means of shaded areas in the form of slanting lines in FIG. 2, 4 or 6. Accordingly, the following values are chosen for the angles $\alpha_i$ of the direction of the current through the sensor element i upon a vanishing measuring field $H_t$ at the location of the sensor element denoted by i=13, 23, 33, 43 in FIG. 8:

$$\alpha_{13}=+45°, \alpha_{23}=+45°, \alpha_{33}=-45°, \alpha_{43}=-45°.$$

FIG. 9 shows a possible spatial implementation of the sensor arrangement 30 of FIG. 8 in a plan view on the plane subtended by the x co-ordinate axis and the y co-ordinate axis. The barberpole structures are shown again diagrammatically and, for the sake of clarity, their alignments in the individual sensor elements 13, 23, 33 and 43 are represented by symbols 81, 82, 83 and 84 shown next to these individual sensor elements 13, 23, 33 and 43, respectively.

For the sensor arrangement 30 of FIG. 8, the output signal UA3 can again be determined in the same way as for the sensor arrangements 7 or 10 of FIG. 2 or 6. The relations for the measuring field at the location of the individual sensor elements i again are, in a first approximation:

$$H_i = H_{Offi} + H_{pk} \sin(n\phi - n^* y_i/r) + H_{ex}$$

In a manner corresponding to FIGS. 2 and 3 and 6 and 7:
$H_{Offi}$ is the offset part of the magnetic field strength of the measuring field at the sensor element i,
$y_i$ is the co-ordinate of the sensor element i and
i is the index with i=13, 23, 33, 43.

The following relation holds for the resistances Ri of the individual sensor elements i:

$$Ri = R_0 + SH_i$$

or $$Ri = R_0 - SH_i,$$

in which the sign before the second addend in these equations again depends on the choice of the angles $\alpha_i$ of the direction of the current through the sensor element i upon a vanishing measuring field $H_t$ at the location of the sensor element i, with i=13, 23, 33, 43, i.e. dependent on the choice of the alignment of the barberpole structures regarding the electric currents flowing through the sensor elements 13, 23, 33 and 43.

The following resistances R13, R23, R33, R43 of the individual sensor elements 13, 23, 33, 43 are obtained for the sensor arrangement 30:

$$R13 = R_0 + S(H_{Off13} + H_{pk} \sin(n\phi - n^* y_{13}/r) + H_{ex})$$

$$R23 = R_0 - S(H_{Off23} + H_{pk} \sin(n\phi - n^* y_{23}/r) + H_{ex})$$

$$R33 = R_0 - S(H_{Off33} + H_{pk} \sin(n\phi - n^* y_{33}/r) + H_{ex})$$

$$R43 = R_0 + S(H_{Off43} + H_{pk} \sin(n\phi - n^* y_{43}/r) + H_{ex})$$

In accordance with FIGS. 8 and 9, the following relations hold for the co-ordinates $y_i$ of the sensor elements i for the assumed structure of the sensor arrangement 30 regarding the x co-ordinate axis:

$$y_{13} = -y_{33} = \Delta y1$$

and $$y_{23} = -y_{43} = \Delta y2;$$

and, under the same assumption, the following relations are obtained for the offset parts $H_{Offi}$ of the magnetic field strength of the measuring field for the individual sensor elements i:

$$H_{Off13} = -H_{Off33}$$

and $$H_{Off23} = -H_{Off43}$$

The output signal UA3 of the sensor arrangement 30 is then in a first approximation:

$$UA3/UB = R33/(R13+R33) - R43/(R23+R43) = \\ -((S^*H_{pk})/(2^*R_0)) \sin(n\phi)[\cos(n^* \Delta y1/r) - \cos(n^* \Delta y2/r)]$$

The output signal UA3 of the sensor arrangement 30 is thus also independent of external fields and therefore not influenced by interference fields. The sensor arrangement 30 shown in FIGS. 8, 9 is thus also robust against magnetic interference fields.

FIG. 10 shows a third embodiment of the invention, comprising a sensor arrangement 40 which, likewise as the sensor arrangement 30 of the second embodiment shown in FIGS. 8, 9, comprises only one Wheatstone bridge built up of a first, a second, a third and a fourth sensor element 14, 24, 34 and 44, of which the first and the third sensor element 14, 34, on the one hand, and the second and the fourth sensor element 24, 44, on the other hand, are arranged in series and connected to form a half bridge each. These half bridges 14, 34 and 24, 44 are arranged between a first power supply terminal 5, which preferably conveys a power supply potential UB again, and a second power supply terminal 6, which preferably conveys ground potential M again.

The junction point between the first and the third sensor element 14, 34 is connected to a first tap 45 on the magnetoresistive sensor arrangement 40 formed as a Wheatstone bridge. In a corresponding manner, the junction point between the second and the fourth sensor element 24, 44 is connected to a second tap 46 on the Wheatstone bridge. An output signal UA4 of the magnetoresistive sensor arrangement 40 is taken between the first and the second tap 45 and 46.

The first, second, third and fourth sensor elements 14, 24, 34 and 44 of the magnetoresistive sensor arrangement 40 have resistances R14, R24, R34 and R44, respectively.

The first and the third sensor element 14, 34 of the first half bridge of the magnetoresistive sensor arrangement 40 are positioned, along a y co-ordinate axis with a first co-ordinate $\Delta y1$ having corresponding values for these two sensor elements 14, 34, symmetrically to a spatial central axis 47 along an x co-ordinate axis in a plane subtended by these x and y co-ordinate axes. The sensor elements 24, 44 of the second half bridge of the magnetoresistive sensor arrangement 40 are also positioned, along the y co-ordinate axis with a second co-ordinate $\Delta y2$ having corresponding values for these two sensor elements 24, 34, symmetrically to the spatial central axis 47 in the same plane. The value of the first co-ordinate $\Delta y1$ is chosen to be larger than the value of the second co-ordinate $\Delta y2$. The two half bridges 14, 34 and 24, 44 thus have different extensions spatially along the y co-ordinate axis.

Also in the sensor arrangement of the third embodiment, the first, second, third and fourth sensor elements 14, 24, 34 and 44 of the sensor arrangement 40 are formed with barberpole structures. The alignment of these barberpole structures in the individual sensor elements is again indicated by shaded areas in the form of slanting lines in FIG. 2, 4, 6 or 8. Accordingly, the angles $\alpha_i$ of the direction of the current through the sensor element i upon a vanishing measuring field $H_i$ at the location of the sensor element denoted by i=14, 24, 34, 44 in FIG. 10 are chosen to be as follows.

$$\alpha_{14}=+45°, \alpha_{24}=+45°, \alpha_{34}=-45°, \alpha_{44}=-45°$$

FIG. 11 shows a possible spatial implementation of the sensor arrangement 40 of FIG. 10 in a plan view on the plane subtended by the x co-ordinate axis and the y co-ordinate axis. The barberpole structures are shown diagrammatically again and, for the sake of clarity, their alignments in the individual sensor elements 14, 24, 34 and 44 are represented by symbols 85, 86, 87 and 88 shown next to these individual sensor elements 14, 24, 34 and 44, respectively.

The sensor arrangement 40 of FIGS. 10, 11 thus corresponds to the sensor arrangement 30 of FIGS. 8, 9 with the exception of the arrangement of the sensor elements 14, 24, 34, 44 along the x co-ordinate axis. For the sensor arrangement 40 of FIGS. 10, 11, a signal corresponding to the output signal UA3 of the sensor arrangement 30 is thus obtained as output signal UA4 in accordance with the following relation:

$$UA4/UB=R34/(R14+R34)-R44/(R24+R44)=\\-((S^*H_{pk})/(2^*R_0)) \sin(n\phi)[\cos(n^*\Delta y1/r)-\cos(n^*\Delta y2/r)]$$

The sensor arrangement 40 in accordance with the third embodiment is particularly advantageous for the case where a supporting field as described hereinbefore has divergencies, i.e. is inhomogeneous along said x co-ordinate axis in the direction, here chosen for the x co-ordinate axis, within the spatial area covered by the sensor arrangement 40. Consequently, along this x co-ordinate axis, sensor elements of the sensor arrangement situated at different co-ordinates are also subjected to different field strengths of the supporting field, which would lead to different sensitivities of these sensor elements regarding the measuring field.

In accordance with an embodiment of the invention and as shown by the third embodiment described hereinbefore, the sensor elements have corresponding co-ordinates in the direction of the x co-ordinate axis which, in this case, is orthogonal to the measuring direction. The x co-ordinate axis which is orthogonal to the measuring direction is aligned also orthogonally to the main direction of the field lines of the applied magnetic field.

The sensitivities of the sensor elements of the different half bridges as regards the measuring field are thus matched so that the robustness of the sensor arrangement to external magnetic fields, and hence also to external interference fields is clearly improved.

A further advantage of the sensor arrangements 30, 40 of the second and third embodiments is not only their compact and simple structure but also the reduced number of electric connections as compared with the sensor arrangement 10 of the first embodiment. This is favorable for the miniaturization of the described sensor arrangements and provides the possibility of building in the arrangement in a standardized housing with only four connection lugs.

The sensor arrangements according to the invention, when used in an arrangement as shown in FIG. 1, always yield a zero-crossing of the output signal, when the center of a tooth or a gap between two teeth of the motion sensor element is situated opposite the spatial central axis of the sensor arrangement. An accurate determination of the position for the motion sensor element is thereby possible with only little effort.

An arrangement of the sensor elements regarding the x co-ordinate axis, as elucidated with reference to the third embodiment, may also be advantageous for the embodiment of the invention implemented with four half bridges.

LIST OF REFERENCE SIGNS 1 first sensor element of the magnetoresistive sensor arrangement 7
2 second sensor element of the magnetoresistive sensor arrangement 7
3 third sensor element of the magnetoresistive sensor arrangement 7
4 fourth sensor element of the magnetoresistive sensor arrangement 7
5 first power supply terminal (for first power supply potential UB)
6 second power supply terminal (for ground potential M)
7 magnetoresistive sensor arrangement
8 working magnet
9 rotating motion sensor element
10 magnetoresistive sensor arrangement in accordance with a first embodiment of the invention
11 first sensor arrangement of the first Wheatstone bridge of the magnetoresistive sensor arrangement 10
12 fifth sensor element of the second Wheatstone bridge of the magnetoresistive sensor arrangement 10
13 first sensor element of the magnetoresistive sensor arrangement 30
14 first sensor element of the magnetoresistive sensor arrangement 40
15 first tap on the first Wheatstone bridge of the magnetoresistive sensor arrangement 10
16 second tap on the first Wheatstone bridge of the magnetoresistive sensor arrangement 10
17 third tap on the second Wheatstone bridge of the magnetoresistive sensor arrangement 10
18 fourth tap on the second Wheatstone bridge of the magnetoresistive sensor arrangement 10
19 spatial central axis of the magnetoresistive sensor arrangement 10
21 second sensor element of the first Wheatstone bridge of the magnetoresistive sensor arrangement 10
22 sixth sensor element of the second Wheatstone bridge of the magnetoresistive sensor arrangement 10
23 second sensor element of the magnetoresistive sensor arrangement 30
24 second sensor element of the magnetoresistive sensor arrangement 40
30 magnetoresistive sensor arrangement in accordance with a second embodiment of the invention (FIGS. 8, 9)
31 third sensor element of the first Wheatstone bridge of the magnetoresistive sensor arrangement 10
32 seventh sensor element of the second Wheatstone bridge of the magnetoresistive sensor arrangement 10
33 third sensor element of the magnetoresistive sensor arrangement 30
34 third sensor element of the magnetoresistive sensor arrangement 40
35 first tap on the magnetoresistive sensor arrangement 30
36 second tap on the magnetoresistive sensor arrangement 30
37 spatial central axis of the magnetoresistive sensor arrangement 30
40 magnetoresistive sensor arrangement in accordance with a third embodiment of the invention (FIGS. 10, 11)
41 fourth sensor element of the first Wheatstone bridge of the magnetoresistive sensor arrangement 10

42 eighth sensor element of the second Wheatstone bridge of the magnetoresistive sensor arrangement 10
43 fourth sensor element of the magnetoresistive sensor arrangement 30
44 fourth sensor element of the magnetoresistive sensor arrangement 40
45 first tap on the magnetoresistive sensor arrangement 40
46 second tap on the magnetoresistive sensor arrangement 40
47 spatial central axis of the magnetoresistive sensor arrangement 40
51 symbol for the alignment of the barberpole structures in sensor element 1
52 symbol for the alignment of the barberpole structures in sensor element 2
53 symbol for the alignment of the barberpole structures in sensor element 3
54 symbol for the alignment of the barberpole structures in sensor element 4
55 symbol for the alignment of the barberpole structures in sensor element 61
56 symbol for the alignment of the barberpole structures in sensor element 62
57 symbol for the alignment of the barberpole structures in sensor element 63
58 symbol for the alignment of the barberpole structures in sensor element 64
60 gradient sensor
61 first sensor element of the gradient sensor 60
62 second sensor element of the gradient sensor 60
63 third sensor element of the gradient sensor 60
64 fourth sensor element of the gradient sensor 60
71 symbol for the alignment of the barberpole structures in sensor element 11
72 symbol for the alignment of the barberpole structures in sensor element 21
73 symbol for the alignment of the barberpole structures in sensor element 31
74 symbol for the alignment of the barberpole structures in sensor element 41
75 symbol for the alignment of the barberpole structures in sensor element 12
76 symbol for the alignment of the barberpole structures in sensor element 22
77 symbol for the alignment of the barberpole structures in sensor element 32
78 symbol for the alignment of the barberpole structures in sensor element 42
81 symbol for the alignment of the barberpole structures in sensor element 13
82 symbol for the alignment of the barberpole structures in sensor element 23
83 symbol for the alignment of the barberpole structures in sensor element 33
84 symbol for the alignment of the barberpole structures in sensor element 43
85 symbol for the alignment of the barberpole structures in sensor element 14
86 symbol for the alignment of the barberpole structures in sensor element 24
87 symbol for the alignment of the barberpole structures in sensor element 34
88 symbol for the alignment of the barberpole structures in sensor element 44
H magnetic field of the working magnet
$H_i$ magnetic field strength of the measuring field at the sensor element i with the resistance Ri
$H_{ex}$ magnetic field strength of an external magnetic field superimposed throughout the plane of the sensor arrangement 7, particularly an interference field, at the sensor element i
$H_{offi}$ offset part of the magnetic field strength of the measuring field at the sensor element i
$H_{off}$ amount of the offset part of the magnetic field strength of the measuring field at the sensor elements 1, 2, 3, 4 (FIGS. 2, 3)
$H_{off}^1$ amount of the offset part of the magnetic field strength of the measuring field at the sensor elements 11, 21, 31, 41 (FIGS. 6, 7)
$H_{off}^2$ amount of the offset part of the magnetic field strength of the measuring field at the sensor elements 12, 22, 32, 42 (FIGS. 6, 7)
$H_{pk}$ amplitude of the magnetic field strength of the measuring field at the sensor element i
i index with i=1, 2, 3, 4, 11, 12, 13, 14, 21, 22, 23, 24, 31, 32, 33, 34, 41, 42, 43, 44, 61, 62, 63, 64, respectively
M second power supply potential (=ground potential)
n number of teeth on the motion sensor element 9 formed as a sensor wheel
r radius of the motion sensor element 9 formed as a sensor wheel
$R_o$ resistance of the individual sensor elements i at the working point
Ri resistance of the sensor element with reference sign i
S change of the resistances Ri in dependence on the measuring field, i.e. slope of the R-H characteristic curve of the sensor elements with the reference sign i or sensitivity of the sensor elements with the reference sign i
UA output signal of the sensor arrangement 7
UA1 first output signal of the first Wheatstone bridge of the magnetoresistive sensor arrangement 10
UA2 second output signal of the second Wheatstone bridge of the magnetoresistive sensor arrangement 10
UA3 output signal of the sensor arrangement 30
UA4 output signal of the sensor arrangement 40
UA6 output signal of the sensor arrangement 60 (=gradient sensor)
UB first power supply potential
x co-ordinate axis
y co-ordinate axis
$y_1$ co-ordinate of the sensor element i along the y co-ordinate axis
z co-ordinate axis
$\alpha_i$ angle of the direction of the current through the sensor element i upon a vanishing measuring field $H_i$ at the location of the sensor element with the reference sign i
$\Delta y$ value of the co-ordinates of the sensor elements 1, 2, 3, 4 of the magnetoresistive sensor arrangement 7
$\Delta y1$ first co-ordinate (value) of the sensor elements 11, 21, 31, 41 of the first Wheatstone bridge of the magnetoresistive sensor arrangement 10 and the sensor elements 13, 33 of the magnetoresistive sensor arrangement 30 and the sensor elements 14, 34 of the magnetoresistive sensor arrangement 40
$\Delta y2$ second co-ordinate (value) of the sensor elements 12, 22, 32, 42 of the second Wheatstone bridge of the magnetoresistive sensor arrangement 10 and the sensor elements 23, 43 of the magnetoresistive sensor arrangement 30 and the sensor elements 24, 44 of the magnetoresistive sensor arrangement 40
Φ motion co-ordinate of the rotating motion sensor element 9 (for example, crankshaft angle of rotation)

The invention claimed is:

1. A sensor arrangement comprising at least two half bridges which are coupled together to form at least a Wheatstone bridge, which sensor arrangement comprises at least two magnetoresistive sensor elements in each half bridge, said sensor elements being sensitive along a measuring direction to the magnetic field strength of an applied magnetic field and having a current flow through said sensor elements oriented parallel to the measuring direction, said sensor elements being adapted to supply a measuring signal in dependence upon a field component of the magnetic field, denoted as measuring field and measured in the measuring direction, at least two of the sensor elements in each half bridge comprising barberpole structures having a mutually different alignment, and the co-ordinates of the sensor elements of at least one of the half bridges and the coordinates of the sensor elements of at least another one of the half bridges being deliberately selected to be different to a predetermined extent along an axis of co-ordinates extending in the measuring direction in order to substantially eliminate an influence of unwanted external magnetic fields on an output signal of the sensor element.

2. A sensor arrangement as claimed in claim 1, characterized by four half bridges.

3. A sensor arrangement as claimed in claim 2, characterized in that the sensor elements of a first and a second of the four half bridges have predetermined first co-ordinates along the axis of co-ordinates extending in the measuring direction, and in that the sensor elements of a third and a fourth of the four half bridges have predetermined second co-ordinates along the axis of co-ordinates extending in the measuring direction.

4. A sensor arrangement as claimed in claim 3, characterized in that the first co-ordinates of the sensor elements of the first and the second half bridge are mutually chosen to be at least substantially symmetrical to a reference point on the axis of co-ordinates extending in the measuring direction, in that the second co-ordinates of the sensor elements of the third and the fourth half bridge are mutually chosen to be at least substantially symmetrical to the reference point on the axis of co-ordinates extending in the measuring direction, and in that the values of the first co-ordinates are chosen to be different from the values of the second co-ordinates.

5. A sensor arrangement as claimed in claim 4, characterized in that the values of the first co-ordinates of the sensor elements of the first and the second half bridge are chosen to be larger than the values of the second co-ordinates of the sensor elements of the third and the fourth half bridge.

6. A sensor arrangement as claimed in claim 3, characterized in that the first and the second half bridge are coupled to form a first Wheatstone bridge, and in that the third and the fourth half bridge are coupled to form a second Wheatstone bridge.

7. A sensor arrangement as claimed in claim 1, characterized by two half bridges which are coupled to form one Wheatstone bridge.

8. A sensor arrangement as claimed in claim 7, characterized in that the sensor elements of a first of the two half bridges have predetermined first co-ordinates along the axis of co-ordinates extending in the measuring direction, and in that the sensor elements of a second of the two half bridges have predetermined second co-ordinates along the axis of co-ordinates extending in the measuring direction.

9. A sensor arrangement as claimed in claim 8, characterized in that the first co-ordinates of the sensor elements of the first half bridge are mutually chosen to be at least substantially symmetrical to a reference point on the axis of co-ordinates extending in the measuring direction, in that the second co-ordinates of the sensor elements of the second half bridge are mutually chosen to be at least substantially symmetrical to the reference point on the axis of co-ordinates extending in the measuring direction, and in that the values of the first coordinates are chosen to be different from the values of the second co-ordinates.

10. A sensor arrangement as claimed in claim 9, characterized in that the values of the first co-ordinates of the sensor elements of the first half bridge are chosen to be larger than the values of the second co-ordinates of the sensor elements of the second half bridge.

11. A sensor arrangement as claimed in claim 7, characterized in that the sensor elements have at least substantially corresponding co-ordinates in the direction of at least a further axis of co-ordinates which is at least substantially orthogonal to the measuring direction.

12. A sensor arrangement as claimed in claim 11, characterized in that the further axis of co-ordinates which is at least substantially orthogonal to the measuring direction is aligned at least substantially orthogonally to the main direction of the field lines of the applied magnetic field.

13. An arrangement for determining the position of a motion sensor element periodically influencing the formation of a magnetic field along its motion co-ordinate, characterized by a sensor arrangement as claimed in claim 1.

* * * * *